United States Patent
Cok

(10) Patent No.: US 7,166,006 B2
(45) Date of Patent: *Jan. 23, 2007

(54) METHOD OF MANUFACTURING-OLED DEVICES BY DEPOSITION ON CURVED SUBSTRATES

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 142 days.

This patent is subject to a terminal disclaimer.

(21) Appl. No.: 11/061,003

(22) Filed: Feb. 18, 2005

(65) Prior Publication Data

US 2005/0170736 A1   Aug. 4, 2005

Related U.S. Application Data

(62) Division of application No. 10/340,025, filed on Jan. 10, 2003, now abandoned.

(51) Int. Cl.
*H05B 33/10* (2006.01)
*H01L 51/56* (2006.01)

(52) U.S. Cl. .............. 445/14; 445/24; 445/25; 427/58; 427/66

(58) Field of Classification Search .................. 427/58, 427/66; 445/14, 24, 25
See application file for complete search history.

(56) References Cited

U.S. PATENT DOCUMENTS

| | | | |
|---|---|---|---|
| 5,288,515 A * | 2/1994 | Nakamura et al. | 427/58 |
| 5,552,249 A | 9/1996 | Jensen et al. | |
| 5,652,930 A | 7/1997 | Teremy et al. | |
| 5,677,546 A | 10/1997 | Yu | |
| 5,688,551 A | 11/1997 | Littman et al. | |
| 6,416,908 B1 | 7/2002 | Klosner et al. | |
| 6,602,540 B1 | 8/2003 | Gu et al. | |
| 6,692,094 B1 | 2/2004 | Cok | |
| 6,800,999 B1 | 10/2004 | Duggal et al. | |

OTHER PUBLICATIONS

VanSlyke et al., "Linear Source Deposition of Organic Layers for Full-Color OLED", *SID 02 Digest*, pp. 886-889.

* cited by examiner

*Primary Examiner*—Mariceli Santiago
(74) *Attorney, Agent, or Firm*—Andrew J. Anderson

(57) ABSTRACT

A method of making an OLED device includes the steps of: providing a curved, rigid substrate; and forming one or more OLED elements on the substrate.

9 Claims, 5 Drawing Sheets

METHOD OF MANUFACTURING-OLED DEVICES BY DEPOSITION ON CURVED SUBSTRATES

CROSS-REFERENCE TO RELATED APPLICATIONS

This application is a divisional of U.S. application Ser. No. 10/340,025, filed Jan. 10, 2003 now abandoned, the disclosure of which is incorporated by reference herein in its entirety.

FIELD OF THE INVENTION

The present invention relates to OLED devices and, more particularly, to OLED devices having a curved format.

BACKGROUND OF THE INVENTION

Light-emissive devices are well known and used for a wide variety of purposes, including area illumination and the representation of information. Traditionally, these light emissive devices rely on evacuated glass enclosures within which are special gases, phosphors, or filaments that emit light upon the application of a current or when stimulated with an electron. More recently, solid-state light-emissive devices have created a robust, long-lived, and practical light source using, for example, light emitting diodes, liquid crystal displays, and plasma displays.

Light emissive devices are useful in a variety of forms. Traditional forms include bulbs rounded in one or two dimensions, for example incandescent and fluorescent light bulbs. Neon lighting is often linear and is used to create lines of light through three dimensions. Large-format information displays such as cinemas rely upon curved screens to maintain a constant focal distance for viewers and to more readily simulate a real-world environment. Hence, conventional light-emissive and display devices are found with a variety of shapes, including flat, curved in one or two dimensions, and linear.

Conventional high-output light-emitting solid-state displays utilize light emitting diodes, typically point sources mounted into a substrate. Because individual devices are individually mounted, these devices can be mounted into a variety of substrates with a variety of shapes. However, because these devices utilize a collection of point light sources, they require additional optical devices such as mirrors and lenses for suitable area illumination. When applied to information display, individually mounted light emitting diodes are expensive and only suitable for low-resolution displays.

Flat-panel solid-state information display devices such as liquid crystal OLED and plasma display devices provide good resolution but are built upon flat panels, typically glass or silicon, and are not readily applied to curved displays.

The use of flexible substrates for displays, typically plastic, is also known. However, the quality, efficiency, and resolution of these displays is limited, as is their lifetime.

There is a need therefore for improved solid-state light emissive devices having a curved substrate for large-area illumination or information presentation.

SUMMARY OF THE INVENTION

The need is met according to the present invention by a method of making an OLED device that includes the steps of: providing a curved, rigid substrate; and forming one or more OLED elements on the substrate.

ADVANTAGES

The present invention has the advantage that it can provide an OLED device having a curved surface. The curved surface may be employed in an area illumination light source to improve the light distribution from the light source, or in a display that reduces the apparent distortion of an image on the display.

DETAILED DESCRIPTION OF THE INVENTION

Figure 1:
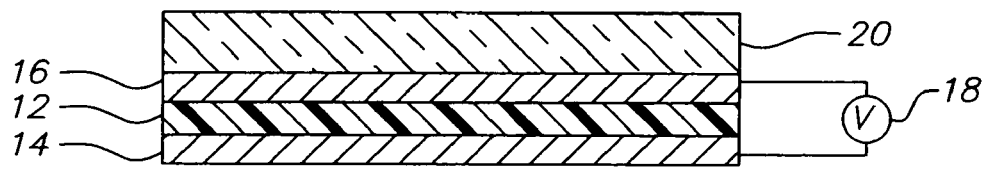
FIG. 1 is a schematic diagram of a prior art OLED.

Referring to FIG. 1, a prior art OLED element includes an organic light-emitting layer 12 disposed between two electrodes 14 and 16, e.g. a cathode and an anode. The organic electro-luminescent layer 12 emits light upon application of a voltage from a power source 18 across the electrodes. The OLED element typically includes a substrate 20 such as glass or plastic. It will be understood that the relative locations of the anode and cathode may be reversed with respect to the substrate. The light-emitting layer 12 may include other layers such as electron or hole injection layers as is known in the art.

Figure 2:
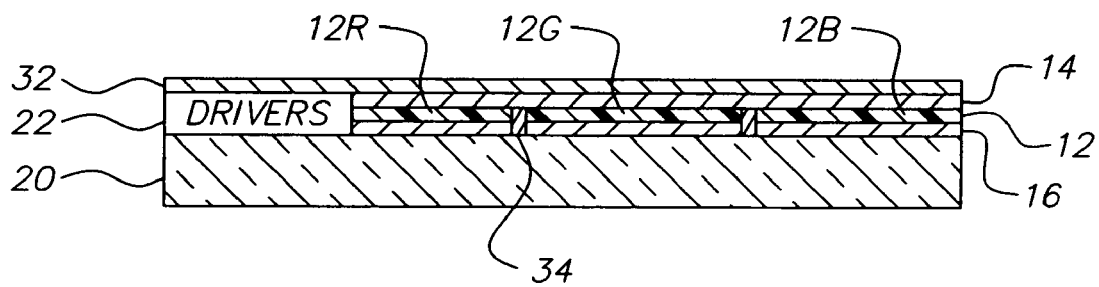
FIG. 2 is a partial cross section of a prior art OLED device having a planar substrate.

Referring to FIG. 2, a prior-art passive-matrix OLED display device 10 includes a planar substrate 20, upon the edge of which may be located driver circuits 22 that provide signals to OLED elements. A pattern of first electrodes 16 provide conduction to individual OLED elements 12R, 12G, 12B that emit different colors of light, for example red, green, and blue. Taken together, the OLED elements 12R, 12G, and 12B are designated as 12. A pattern of second electrodes 14 provides conduction to complete an electrical circuit for providing power to the OLED elements 12. The layers 12, 14, and 16 are encapsulated with a hermetically sealed encapsulating cover 32 or an encapsulating layer placed above the top electrode 14. An additional electrode protection layer may also be provided above the electrode 14.

Alternatively, single color OLED elements, for example white, may be used to provide a single color display. Also, color filters (not shown) may be located above the single color OLED elements to provide a colored display. The light emitting layers, electrodes, color filters, and manufacturing processes to create a passive-matrix OLED display device are all known in the art.

Figure 3:
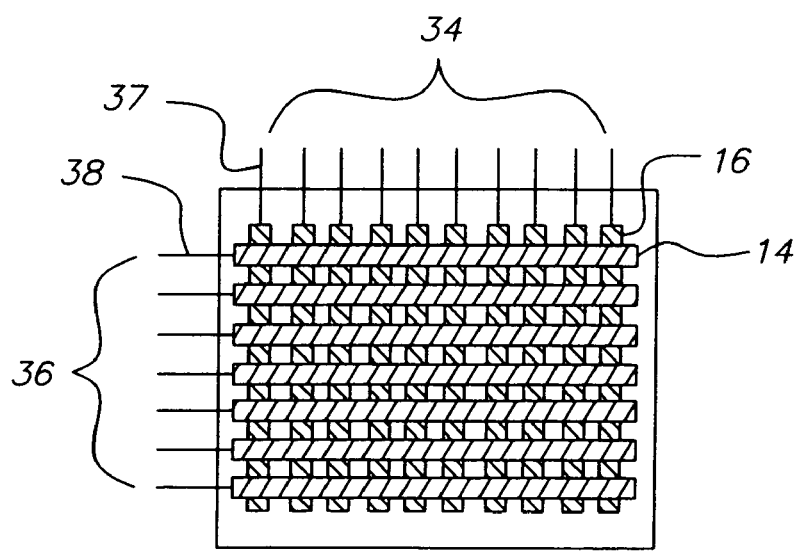
FIG. 3 is a schematic diagram illustrating the arrangement of electrodes in a prior art passive matrix OLED display device.

Referring to FIG. 3, a passive-matrix prior-art display device includes a plurality of electrodes 16 and 14 that are individually energized through column 34 and row 36 connectors. Light-emissive OLED materials (not shown) are located between the electrodes 16 and 14 where they overlap. When an OLED element is energized through one column signal 37 and one row signal 38, the OLED element at the column and row intersection is energized and light is emitted. With this design, an entire row or column of OLED elements may be energized simultaneously, but only one row or column may be operated at one time.

Figure 4:
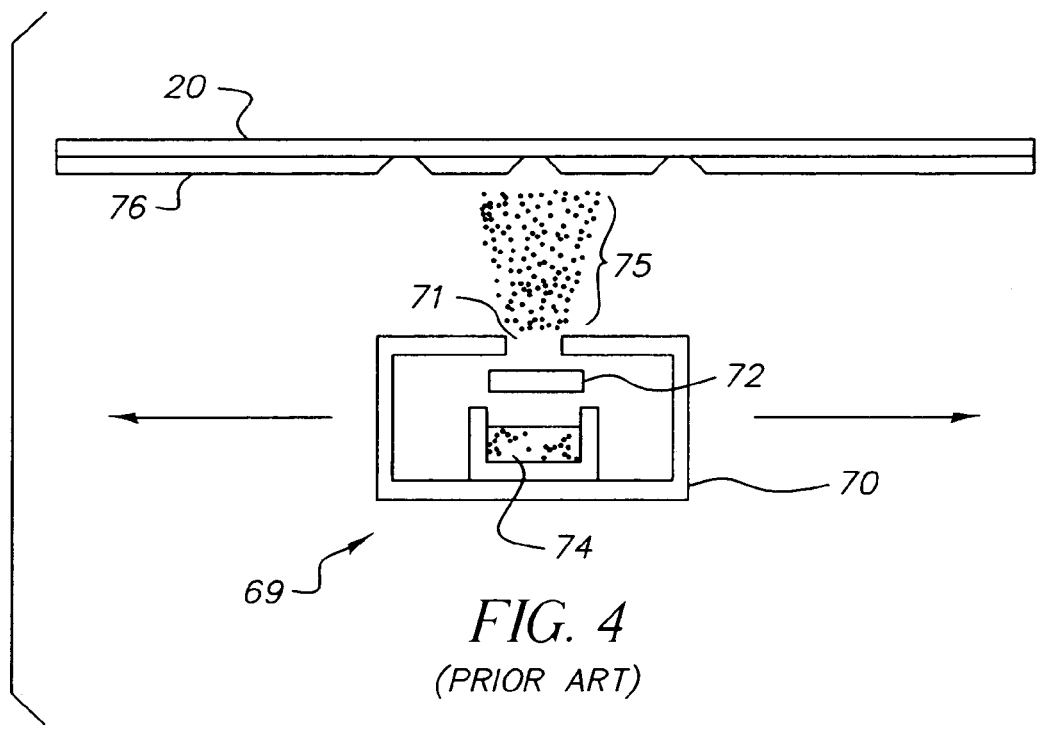
FIG. 4 is a schematic diagram illustrating a prior art technique for depositing OLED materials on a planar substrate using a linear source.

In conventional practice, the materials used in an OLED device are deposited on a planar substrate using a source of heated material that is evaporated and exposed through a mask onto a substrate. Referring to FIG. 4, a substrate 20 is exposed through a mask 76 for the deposition of material 75 evaporated from a linear source 69 including a container 70 having a slit opening 71 and a baffle heater 72 heating the contents 74 of the container. The heated material 74 evaporates, rises up from the boat around the heater 72 and through the slit 71 to condense on the mask 76 and substrate 20. After adequate material is deposited, the mask 76 is removed leaving a patterned layer of material deposited on the substrate. In a continuous exposure process, the container 70 is moved at a carefully controlled rate from one side of the substrate 20 to the other side to deposit material across the entire surface. This process is described in detail in "Linear Source Deposition of Organic Layers for Full-Color OLED" by Van Slyke et al., SID 02 Digest, Vol. 33, No. 2, pp. 886–889, 2002.

Figure 5:
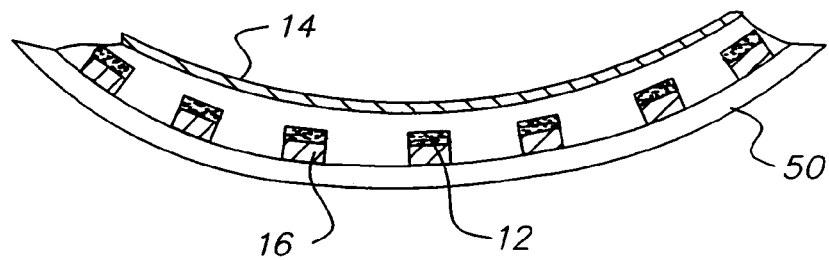
FIG. 5 is a schematic diagram illustrating an OLED display device having a rigid curved substrate according to the present invention.

Referring to FIG. 5, one embodiment of an OLED device according to the present invention includes a curved, rigid substrate 50 having an electrode 16 deposited upon it. An OLED element 12 is deposited upon the electrode 16 and a second electrode 14 is deposited on the OLED element 12. The electrodes are arranged in orthogonal arrays and are connected to column and row drivers as shown in FIG. 3. In operation, the electrodes are energized conventionally and light is emitted from the OLED elements 12.

Figure 6:
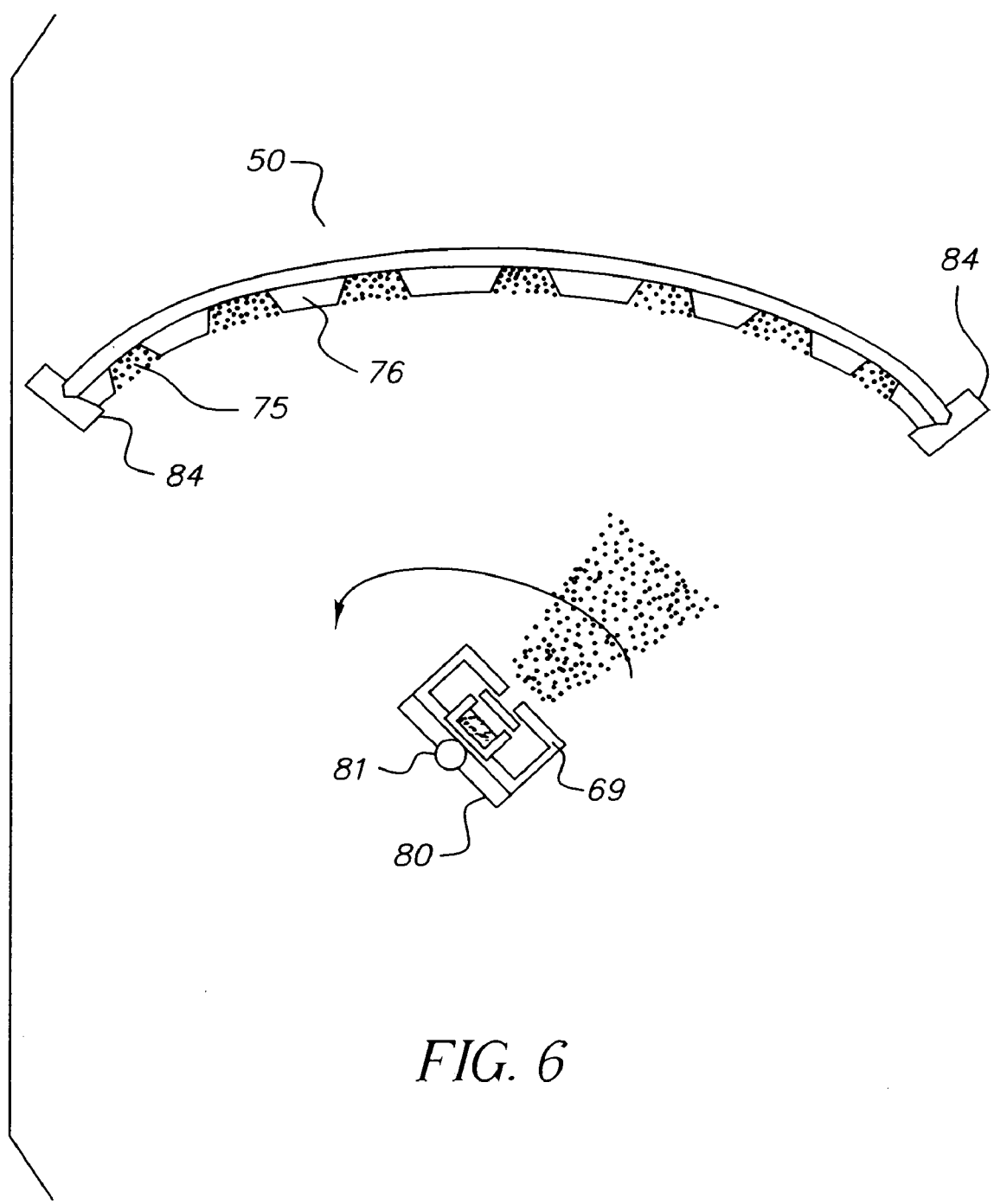
FIG. 6 is a schematic diagram illustrating a method of depositing OLED materials on the inside of a curved substrate according to one embodiment of the present invention.

Referring to FIG. 6, according to one embodiment of the present invention, the curved surface of the substrate defines a circular cylinder and OLED materials are deposited through a mask 76 held on the inside surface of the curved substrate to form the OLED elements by rotating a linear source 69 about the cylindrical axis of the curved substrate. This source is otherwise conventional and incorporates a container, heater, baffle, etc., as described above with the additional feature that the linear source 69, is mounted on a rotating platform 80.

The rotating platform 80 is located so that the point 81 about which the linear source 69 rotates is the center of curvature of the substrate 50. As the source is rotated, material is evaporated and emitted through the source slit and deposited through the mask. It is important to over-scan the source, that is, deposit material beyond the mask edge to ensure that each mask opening is properly exposed for the same amount of time. The rate of rotation is determined by the amount of material to be deposited. It is also possible to hold the linear source steady and to rotate the substrate about the center of curvature.

This process employs a curved mask 76 held in close contact with the substrate 50 during deposition of the OLED materials. Tests performed by the applicant have demonstrated that conventional planar masks 10 to 500 microns in thickness may be conformed to substrates having a radius of curvature as small as 1 to 5 cm. The thickness of the mask required depends on the radius of curvature of the substrate, with smaller radii requiring thinner masks. Typically, masks of 50 microns are suitable for conventional computer monitor displays and are composed of conventional materials, such as Invar, with suitably small coefficients of thermal expansion. The curved mask 76 may be held in position with clips 84 at the edges of the curved surface during material deposition. The mask is typically held in compression against the substrate to provide a firm, rugged contact.

Figure 7:
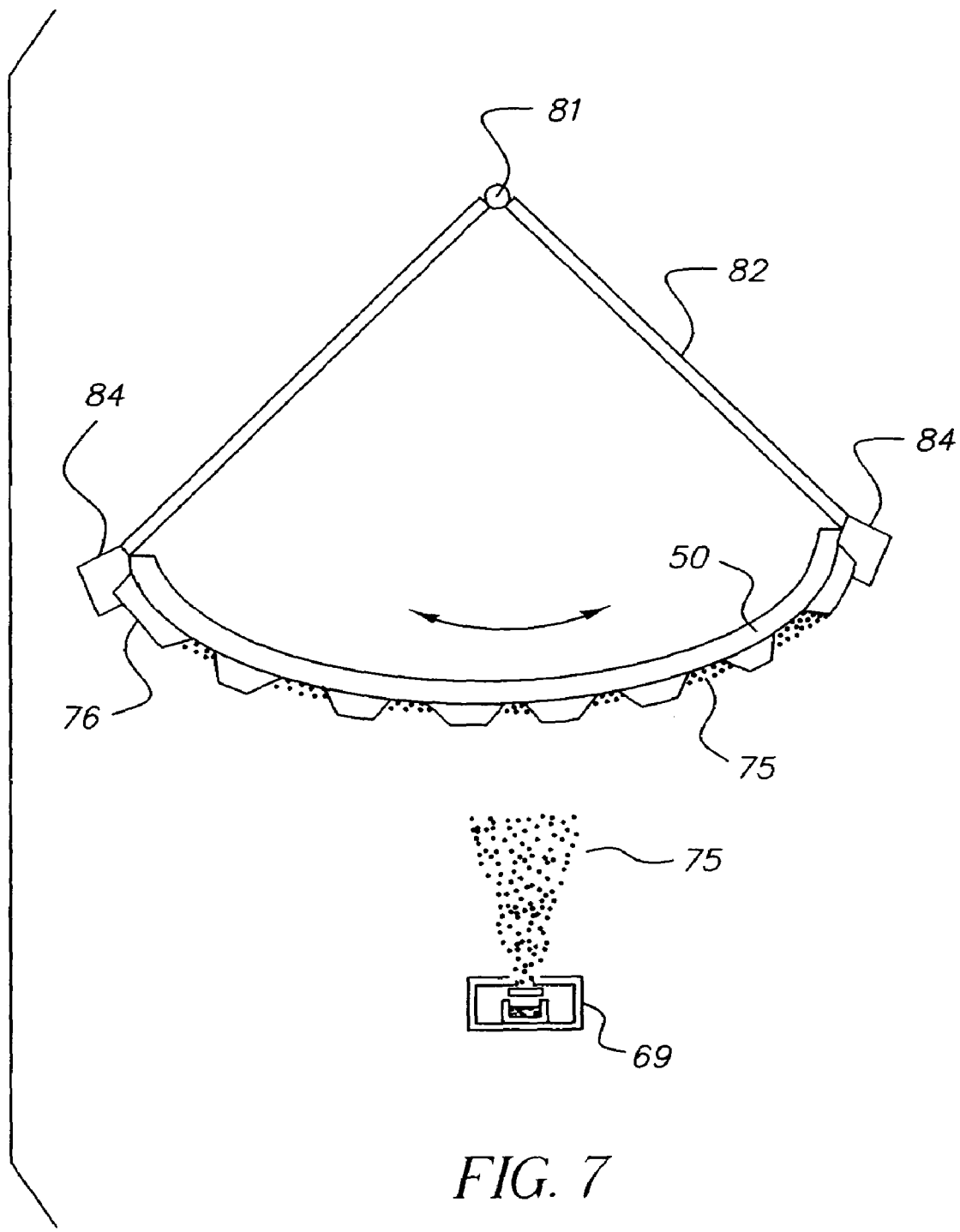
FIG. 7 is a schematic diagram illustrating a method of depositing OLED materials on the outside of a curved substrate according to one embodiment of the present invention.

As shown in FIG. 7, an OLED element may also be deposited upon the outside surface of the substrate. In this case, the substrate is more readily rotated about its center of curvature and the linear source placed on the outside of a circle defined by the rotation of the substrate. The curved rigid substrate 50 is held by a fixture 82 that is rotated about a point 81 located at the center of curvature of the curved rigid substrate 50. The linear source 69 is located on the outside of the substrate 50 and does not move as evaporated material 75 is deposited over the surface of the curved substrate 50. The mask 76 is held in tension against the surface of the substrate 50.

Alternatively, the OLED materials can be deposited onto the curved surface of the substrate using a compressed fluid deposition technique as described in copending U.S. Ser. No. 10/201,506 filed Jul. 23, 2002 by Cok, which is incorporated herein by reference. According to this embodiment, the fluid applicator emits a linear stream of fluid and replaces the linear source 69.

According to a further alternative, the OLED materials may be deposited by thermal sublimation from a donor as disclosed in U.S. Pat. No. 5,688,551, issued Nov. 18, 1997 to Littman et al. According to this embodiment, the donor is a sheet that is held in linear contact with the substrate and is heated, for example with a laser beam or thermal head along a moving line of contact. The thermal sublimation apparatus transfers successive lines of OLED material and replaces the linear source 69.

According to a further alternative, the OLED materials can be deposited by a linear inkjet type head. The linear inkjet head emits a linear stream of fluid OLED material and replaces the linear source 69.

With the sequential, repeated use of the deposition mechanisms described above, a series of layers of OLED materials may be built up on the substrate to create OLED elements. The OLED elements may be powered through the connections affixed to the conductors as shown in FIG. 3.

The OLED device can be controlled using conventional means with driver circuitry external to the substrate. For OLED devices with a larger number of light emissive elements, a larger number of driver circuits may be necessary and operated in parallel to reduce the flicker inherent in operating a high-resolution display one emissive element, row, or column at a time.

In an alternative embodiment of the present invention, active switching devices such as thin-film transistors may be deposited on the substrate to simplify the external control of the device. If the curve of the substrate is sufficiently low and the deposition of active switching devices is limited to an area, for example along one flat edge, conventional processes may be used. This is useful for providing on-substrate row or column drivers that are typically found at the edge of a substrate. Alternatively, known means for depositing active switching devices on curved substrates may be employed. For example, U.S. Pat. No. 6,416,908 B1 issued Jul. 9, 2002 to Klosner et al. describes the use of a high-resolution lens to image a curved mask directly onto a curved substrate, and U.S. Pat. No. 5,552,249 issued Sep. 3, 1996 to Jensen et al. describes patterning curved surfaces Using these known techniques, active switching devices can be complemented with the organic materials deposition process of the present invention to create an OLED device with active components.

The present invention may be used in both top- and bottom-emitting OLED devices. In a top-emitting device, the device emits light through a cover protecting and encapsulating the OLED light emissive materials. This cover may comprise, for example, a coated layer or a curved glass cover adhered at the edges of the cover to the substrate. Suitable materials and adhesives are well-known and commercially available. The substrate may be opaque or reflective. In a bottom-emitting OLED device, the light is emitted through the substrate. In this case, the cover may be opaque or reflective and the substrate is transparent. Suitable transparent materials, such as glass, are well known and in use today. It is also possible to use transparent materials for both the substrate and the cover, thereby permitting light to escape from the OLED device through both sides.

The present invention may be applied to a variety of OLED light emitting devices. In particular, the light emissive curved rigid substrate of the present invention is well adapted to use for area illumination. In this embodiment, only one or a relatively small number of light emissive areas that are largely co-extensive with the rigid curved substrate need be formed on the substrate. Simpler masks with one or several openings may be used. Fewer connections are necessary for powering the area illumination device and a large variety of configurations and shapes may be provided.

Figure 8:
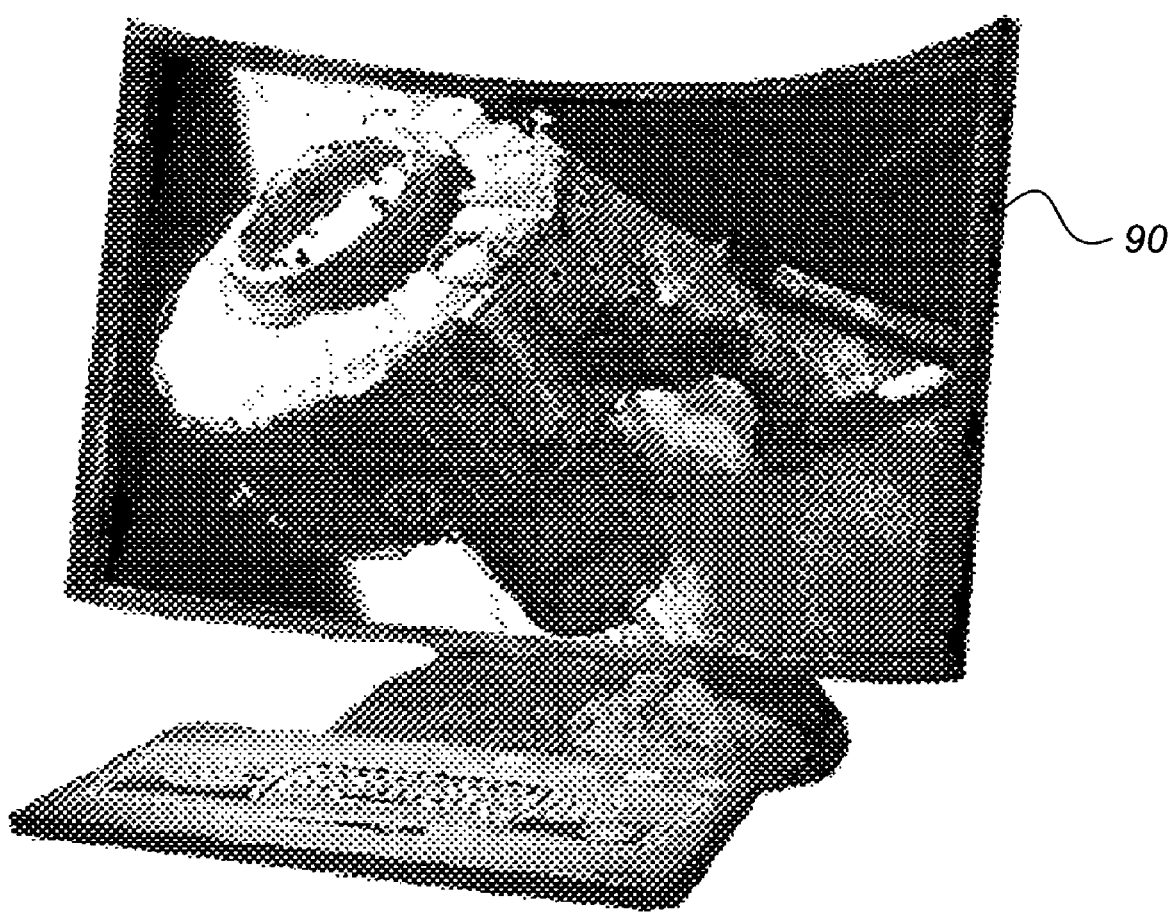
FIG. 8 is an illustration of an OLED display on a curved substrate employed as a computer monitor according to the present invention.

The present invention may also be applied to information display devices. In particular, applications requiring a relatively large display for a single user are well adapted to the use of a curved substrate display, for example a panoramic computer monitor for desktop use. These display devices may be top emitter or bottom emitter, passive matrix or active matrix and may employ different control schemes requiring various numbers of controllers and connections, as described above. Referring to FIG. 8, a computer monitor 90 includes an OLED display device with a curved rigid substrate according to the present invention that is employed as a component within an otherwise conventional desktop computer. In a further embodiment of the present invention, the curved monitor is a panoramic display, that is one that has at least a 16:9 ratio between height and width and subtends at least 45 degrees when viewed at a normal viewing distance.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 9:
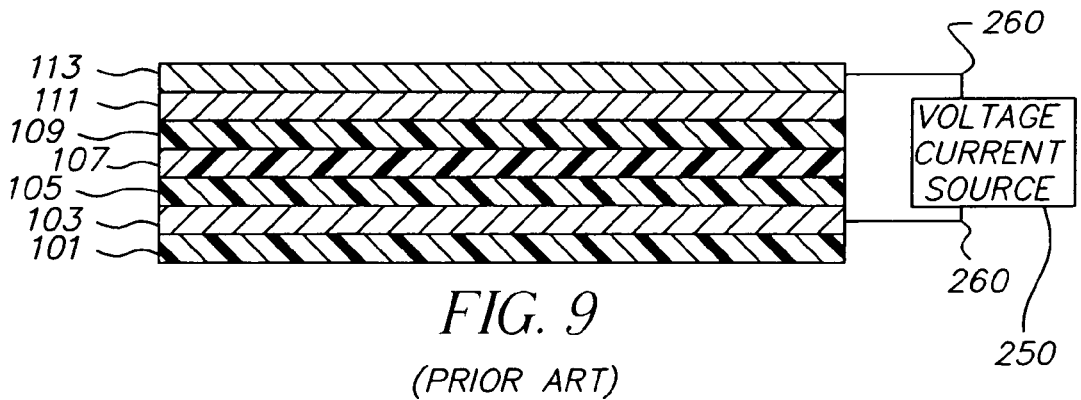
FIG. 9 is a schematic cross section of an OLED according to the prior art.

There are numerous configurations of the organic layers wherein the present invention can be successfully practiced. A typical structure is shown in FIG. 9 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be transmissive or opaque. In the case wherein the substrate is transmissive, I reflective or light absorbing layer is used to reflect the light through the cover or to absorb the light, thereby improving the contrast of the display. Substrates can include, but are not limited to, glass, plastic, semiconductor materials, silicon, ceramics, and circuit board materials. Of course it is necessary to provide a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylarnines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-napbthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]bipbenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-napbthyl)-N-(2-naphthyl)amino]naphthalene
N,N,N',N'-Tetra(2-naphthyl)4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]bipbenyl
2,6-Bis[N,N-di(2-napbthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or an electrode protection layer beneath the cover.

The invention has been described in detail with particular reference to certain preferred embodiments thereof, but it will be understood that variations and modifications can be effected within the spirit and scope of the invention.

PARTS LIST

12 Oled layer
12R red-light emitting oled layer
12G green-light emitting oled layer
12B blue-light emitting oled layer
14 electrode layer
16 electrode layer
18 power source
20 substrate
22 driver circuits
32 encapsulating cover
34 column connectors
36 row connectors
37 column signal
38 row signal
50 curved rigid substrate
69 linear source
70 container
71 slit
72 baffle heater
74 contents
75 oled material
76 mask
80 platform
81 point of rotation
82 fixture
84 clips
90 computer monitor
101 substrate
103 anode layer
105 hole-injecting layer
107 bole-transporting layer
109 light-emitting layer
111 electron-transporting layer
113 cathode layer
250 voltage/current source
260 conductive wiring

What is claimed is:

1. A method of making an OLED device, comprising the steps of:

a) providing a curved, rigid substrate; and b) forming one or more OLED elements on the substrates; wherein the curved substrate has a cylindrical curve, and the step of forming the one or more OLED elements includes depositing material on the substrate from a linear source, where the linear source is positioned parallel to an axis of the cylindrical curve and either the linear source or the curved substrate is rotated about the cylindrical axis.

2. The method claimed in claim 1, wherein the step of forming the OLED element(s) includes evaporation of material from the linear source.

3. The method claimed in claim 1, wherein the step of forming the OLED element(s) includes depositing material with a stream of compressed fluid from the linear source.

4. The method claimed in claim 1, wherein the step of forming the OLED element(s) includes depositing material using a linear inkjet print head.

5. The method claimed in claim 1, wherein the OLED element(s) are formed on the inside of the curved substrate through a mask held in compression against the substrate.

6. The method claimed in claim 1, wherein the OLED element(s) are formed on the outside of the curved substrate through a mask held in tension against the substrate.

7. The method claimed in claim 1, wherein the cylindrical curve is circular.

8. The method claimed in claim 7, wherein the OLED element(s) are formed on the inside of the circular cylindrical curve and the linear source rotated with respect to the substrate about the cylindrical axis.

9. The method claimed in claim 7, wherein the OLED element(s) are formed on the outside of the circular cylindrical curve and the substrate is rotated with respect to the linear source about the cylindrical axis.

* * * * *